United States Patent
Izuka et al.

(10) Patent No.: US 8,860,075 B2
(45) Date of Patent: Oct. 14, 2014

(54) SEMICONDUCTOR LIGHT EMITTING DEVICE

(71) Applicant: Kabushiki Kaisha Toshiba, Minato-ku (JP)

(72) Inventors: Miyuki Izuka, Kanagawa-ken (JP); Susumu Obata, Kanagawa-ken (JP); Akiya Kimura, Kanagawa-ken (JP); Akihiro Kojima, Kanagawa-ken (JP); Yosuke Akimoto, Kanagawa-ken (JP); Yoshiaki Sugizaki, Kanagawa-ken (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 13/962,643

(22) Filed: Aug. 8, 2013

(65) Prior Publication Data

US 2013/0320383 A1 Dec. 5, 2013

Related U.S. Application Data

(63) Continuation of application No. PCT/JP2011/003245, filed on Jun. 8, 2011.

(30) Foreign Application Priority Data

Feb. 9, 2011 (JP) .................. 2011-025812

(51) Int. Cl.
| | | |
|---|---|---|
| *H01L 33/00* | (2010.01) | |
| *H01L 33/62* | (2010.01) | |
| *H01L 33/50* | (2010.01) | |
| *H01L 33/38* | (2010.01) | |
| *H01L 33/48* | (2010.01) | |
| *H01L 33/58* | (2010.01) | |
| *H01L 33/44* | (2010.01) | |

(52) U.S. Cl.
CPC .............. *H01L 33/62* (2013.01); *H01L 33/50* (2013.01); *H01L 33/0079* (2013.01); *H01L 33/38* (2013.01); *H01L 33/486* (2013.01); *H01L 33/58* (2013.01); *H01L 2924/0002* (2013.01); *H01L 33/44* (2013.01)

USPC .............. 257/99; 257/750; 257/776; 257/781

(58) Field of Classification Search
CPC .......... H01L 33/20; H01L 33/36; H01L 33/38
USPC ............. 257/98, 99, 750, 773, 776, 777, 778, 257/780, 781
See application file for complete search history.

(56) References Cited

U.S. PATENT DOCUMENTS

| | | |
|---|---|---|
| 6,331,450 B1 | 12/2001 | Uemura |
| 8,110,421 B2 | 2/2012 | Sugizaki et al. |

(Continued)

FOREIGN PATENT DOCUMENTS

| | | |
|---|---|---|
| EP | 2 194 586 | 6/2010 |
| JP | 10-163536 | 6/1998 |

(Continued)

OTHER PUBLICATIONS

Office Action issued on Jul. 30, 2013 in the corresponding Taiwanese Patent Application No. 100121995 (with English Translation).

(Continued)

*Primary Examiner* — Colleen Matthews
*Assistant Examiner* — Quovaunda V Jefferson
(74) *Attorney, Agent, or Firm* — Oblon, Spivak, McClelland, Maier & Neustadt, L.L.P.

(57) ABSTRACT

According to one embodiment, a semiconductor light emitting device includes a semiconductor layer, a p-side electrode, an n-side electrode, a p-side metal pillar, an n-side metal pillar, and an insulator. The semiconductor layer includes a first surface, a second surface opposite to the first surface, and a light emitting layer. The p-side metal pillar includes a p-side external terminal. The n-side metal pillar includes an n-side external terminal. At least one selected from an area and a planar configuration of the p-side external terminal is different from at least one selected from an area and a planar configuration of the n-side external terminal.

20 Claims, 15 Drawing Sheets

(56) References Cited

U.S. PATENT DOCUMENTS

| | | | |
|---|---|---|---|
| 8,148,183 | B2 | 4/2012 | Hamasaki et al. |
| 8,278,676 | B2 | 10/2012 | Kojima et al. |
| 8,288,843 | B2 | 10/2012 | Kojima et al. |
| 8,319,246 | B2 | 11/2012 | Sugizaki et al. |
| 8,350,285 | B2 | 1/2013 | Sugizaki et al. |
| 8,367,523 | B2 | 2/2013 | Sugizaki et al. |
| 8,368,089 | B2 | 2/2013 | Kojima et al. |
| 8,373,192 | B2 | 2/2013 | Sugizaki et al. |
| 8,377,726 | B2 | 2/2013 | Kojima et al. |
| 8,378,377 | B2 | 2/2013 | Sugizaki et al. |
| 8,436,378 | B2 | 5/2013 | Kojima et al. |
| 8,445,916 | B2 | 5/2013 | Kojima et al. |
| 2004/0188696 | A1 | 9/2004 | Hsing Chen et al. |
| 2005/0194605 | A1* | 9/2005 | Shelton et al. ............ 257/99 |
| 2007/0267650 | A1* | 11/2007 | Hsieh ...................... 257/99 |
| 2010/0012963 | A1 | 1/2010 | Hwan |
| 2010/0140640 | A1 | 6/2010 | Shimokawa et al. |
| 2011/0204396 | A1 | 8/2011 | Akimoto et al. |
| 2011/0220931 | A1 | 9/2011 | Kojima et al. |
| 2011/0284909 | A1 | 11/2011 | Sugizaki et al. |
| 2011/0284910 | A1 | 11/2011 | Iduka et al. |
| 2011/0291148 | A1 | 12/2011 | Sugizaki et al. |
| 2011/0297965 | A1 | 12/2011 | Akimoto et al. |
| 2011/0297980 | A1 | 12/2011 | Sugizaki et al. |
| 2011/0297995 | A1 | 12/2011 | Akimoto et al. |
| 2011/0298001 | A1 | 12/2011 | Akimoto et al. |
| 2011/0300651 | A1 | 12/2011 | Kojima et al. |

FOREIGN PATENT DOCUMENTS

| | | |
|---|---|---|
| JP | 2000-244012 | 9/2000 |
| JP | 2002-118293 | 4/2002 |
| JP | 2005-079550 | 3/2005 |
| JP | 2005-079551 | 3/2005 |
| JP | 2007-123704 A | 5/2007 |
| JP | 2010-135693 A | 6/2010 |
| JP | 2010-251807 A | 11/2010 |
| TW | 201031033 A1 | 8/2010 |
| WO | 2011/002078 | 1/2011 |

OTHER PUBLICATIONS

U.S. Appl. NO. 13/940,754, filed Jul. 12, 2013, Sugizaki et al.
International Search Report issued on Oct. 12, 2011 for PCT/JP2011/003245 filed on Jun. 8, 2011 in English.
International Written Opinion issued on Oct. 12, 2011 for PCT/JP2011/003245 filed on Jun. 8, 2011 in English.
Office Action issued on Mar. 19, 2014 in the counterpart Japanese patent Application No. 2011-025812 (with English Translation).
Korean Office Action issued on Jun. 3, 2014 in the counterpart Korean patent application No. 10-2013-7020951 with English translation, 11 pages.

* cited by examiner

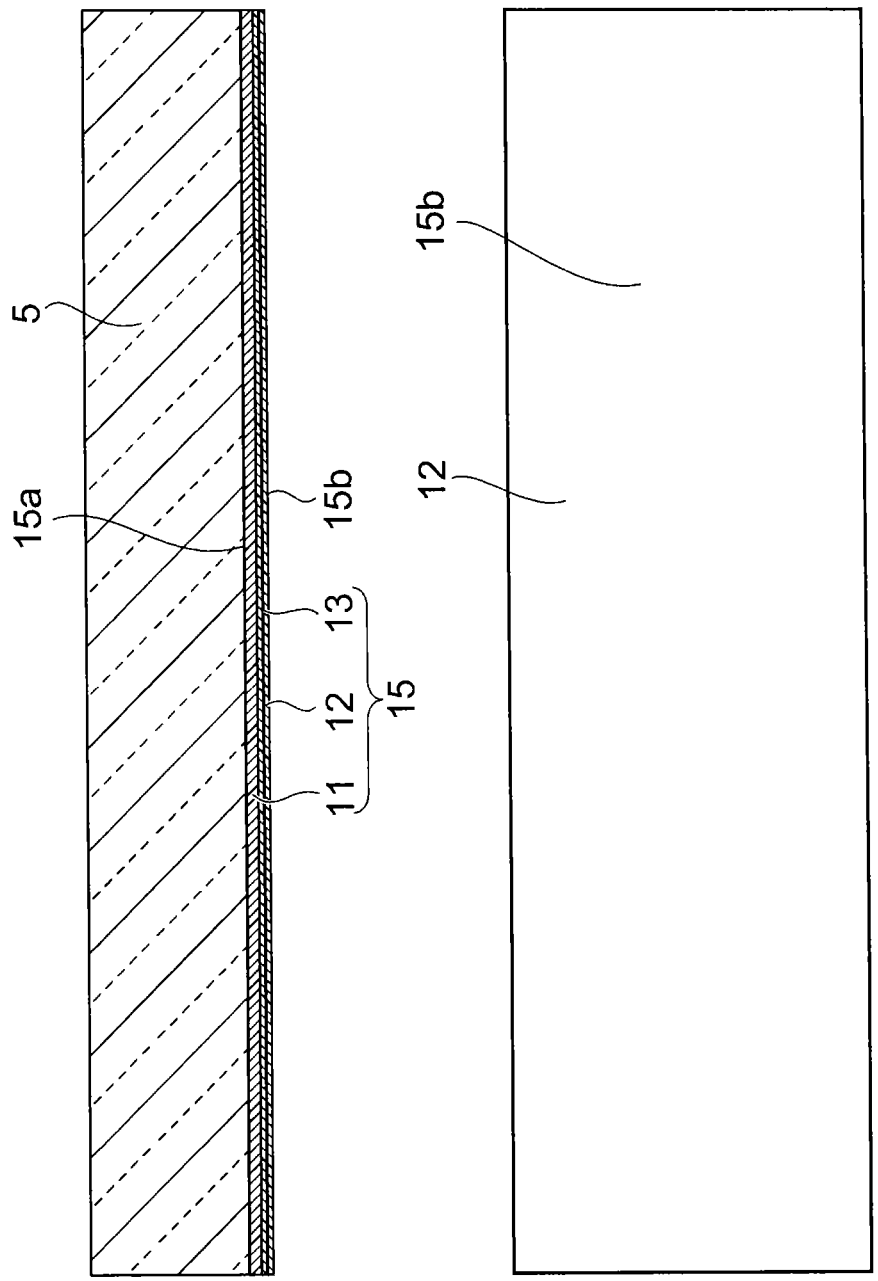

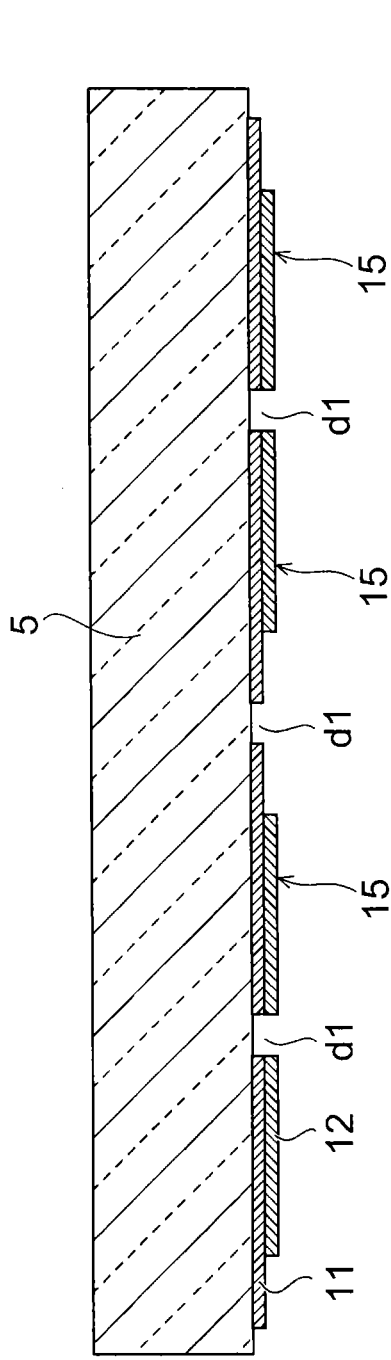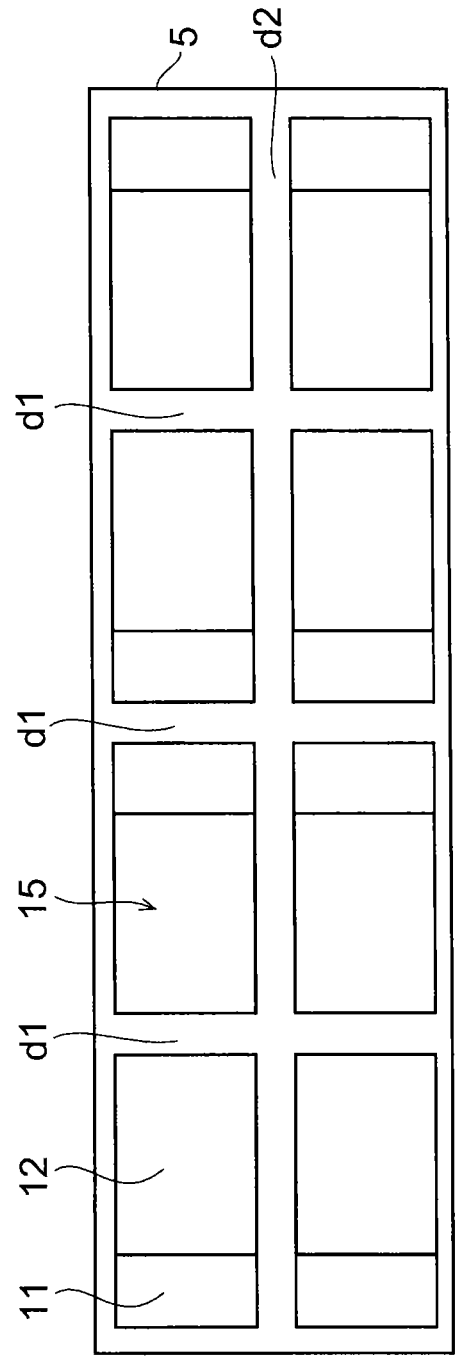
FIG. 5A
FIG. 5B

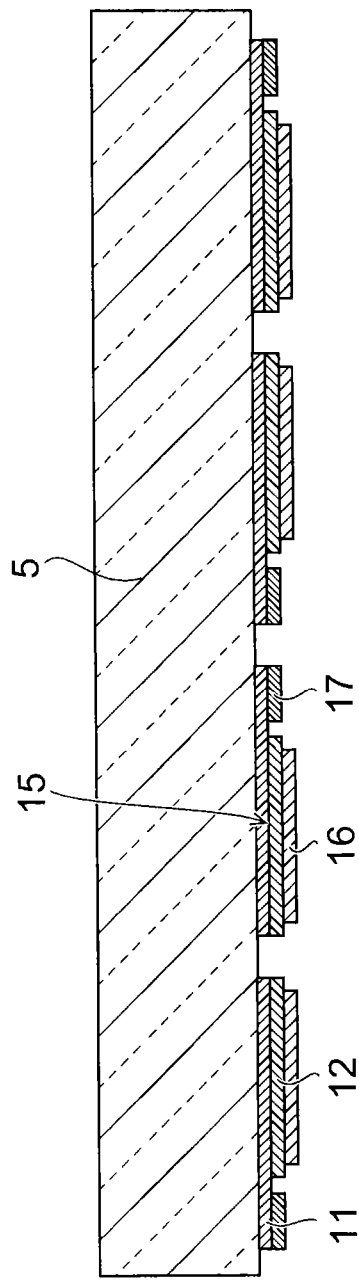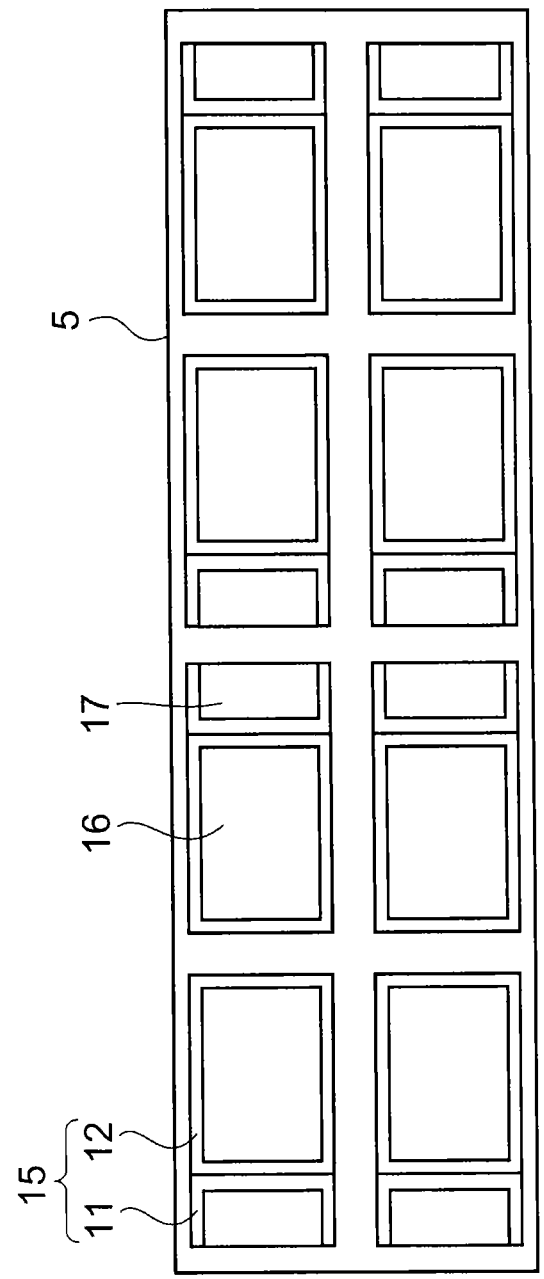
FIG. 6A
FIG. 6B

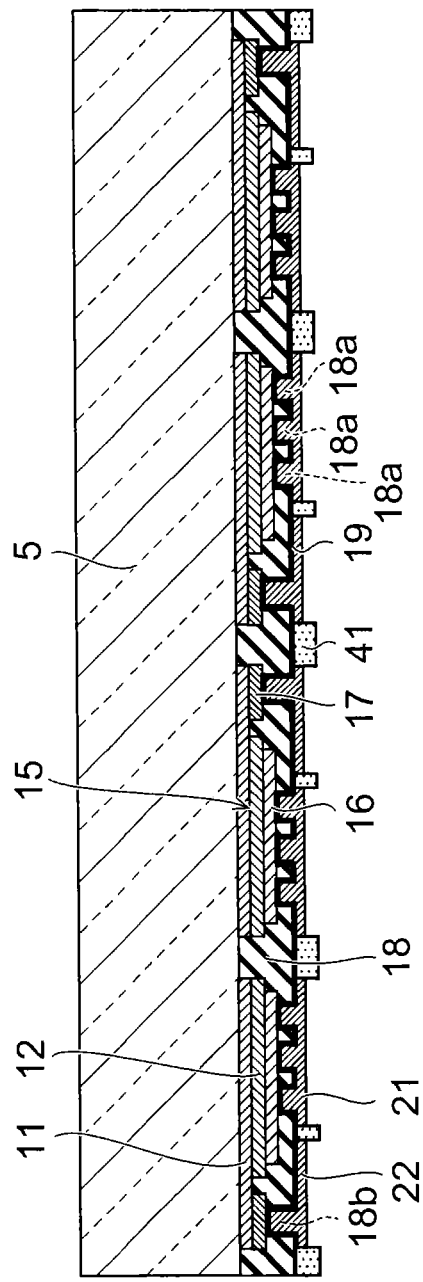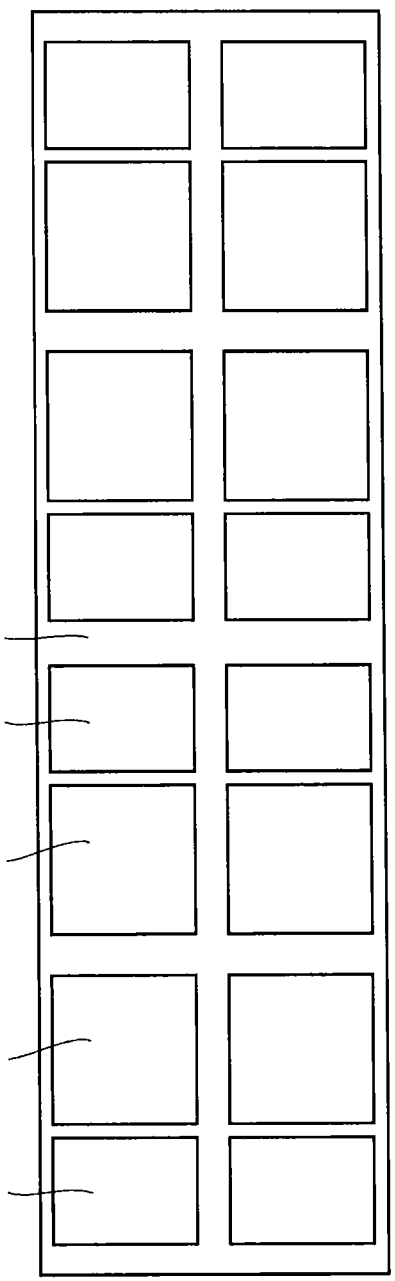
FIG. 8A
FIG. 8B

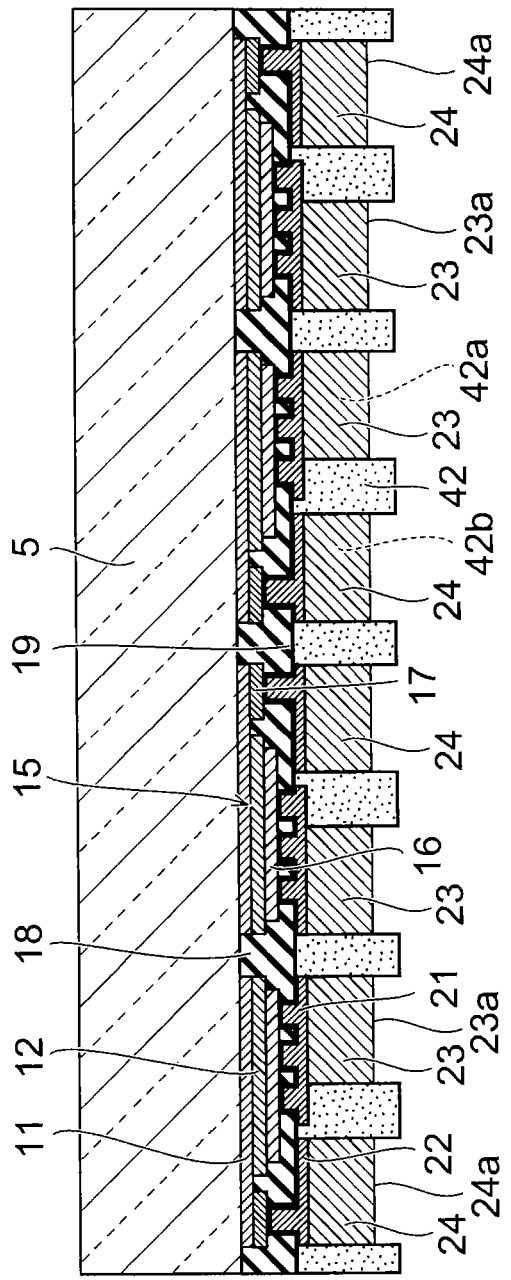
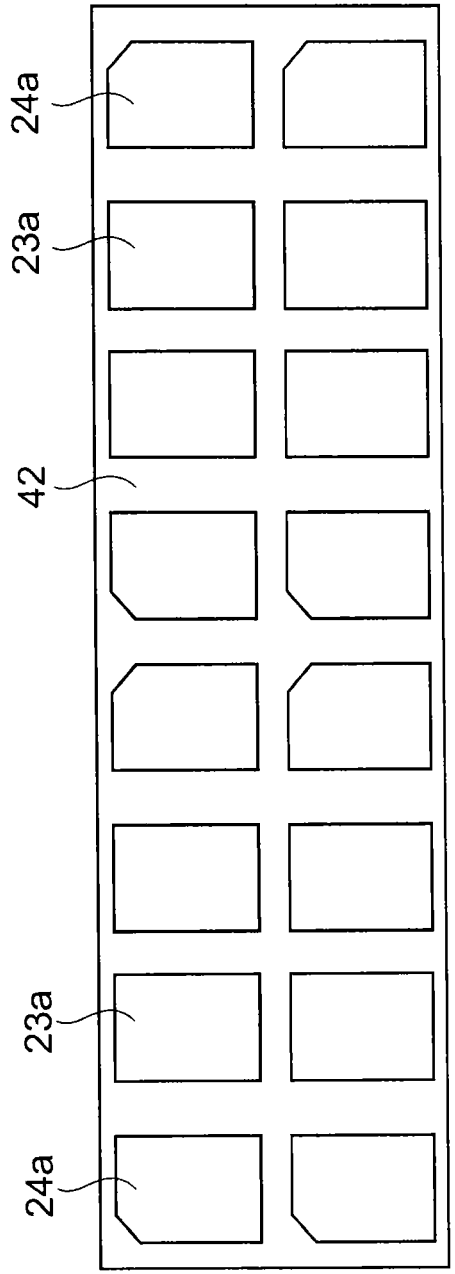
FIG. 10A
FIG. 10B

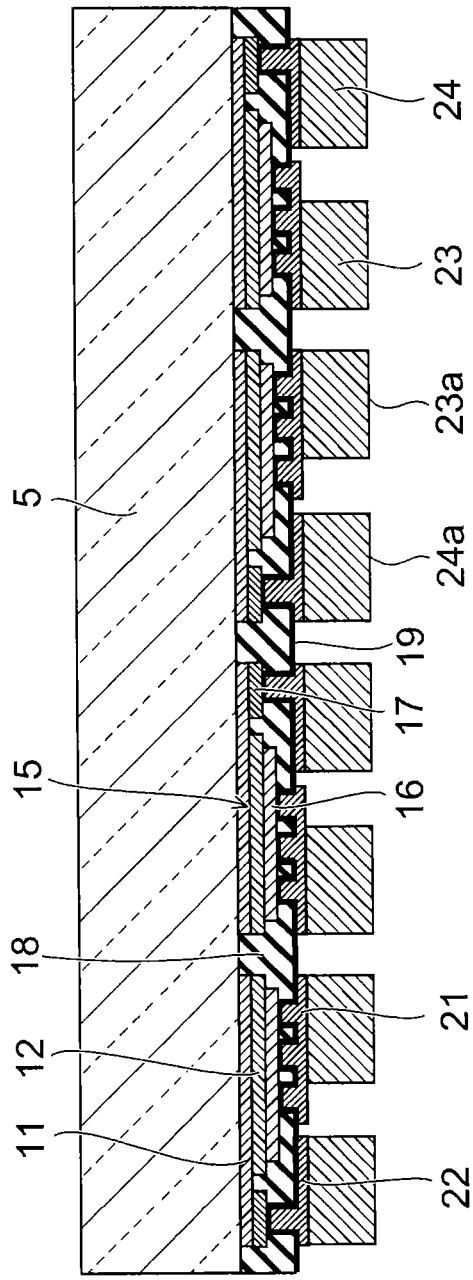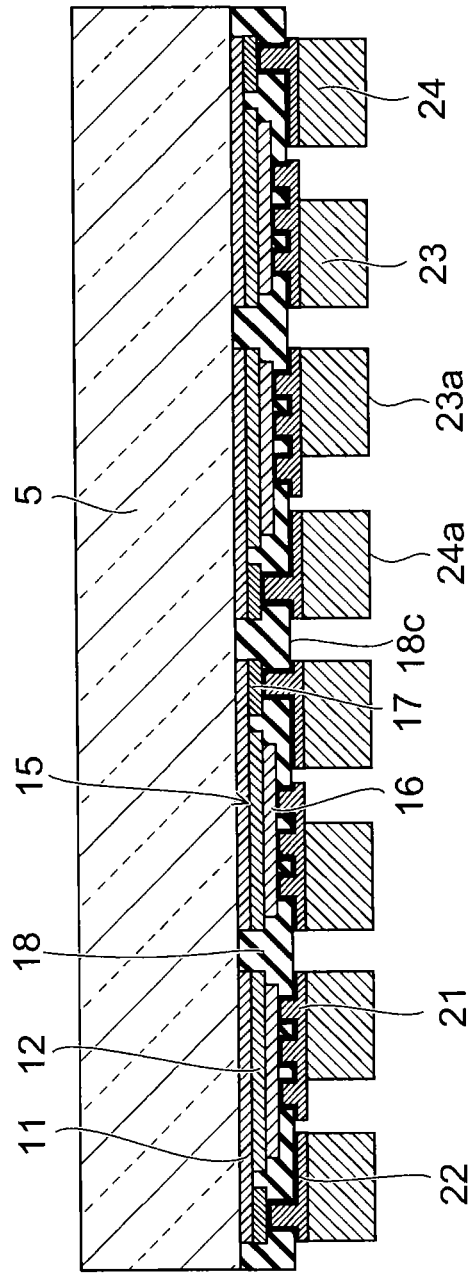
FIG. 11A
FIG. 11B

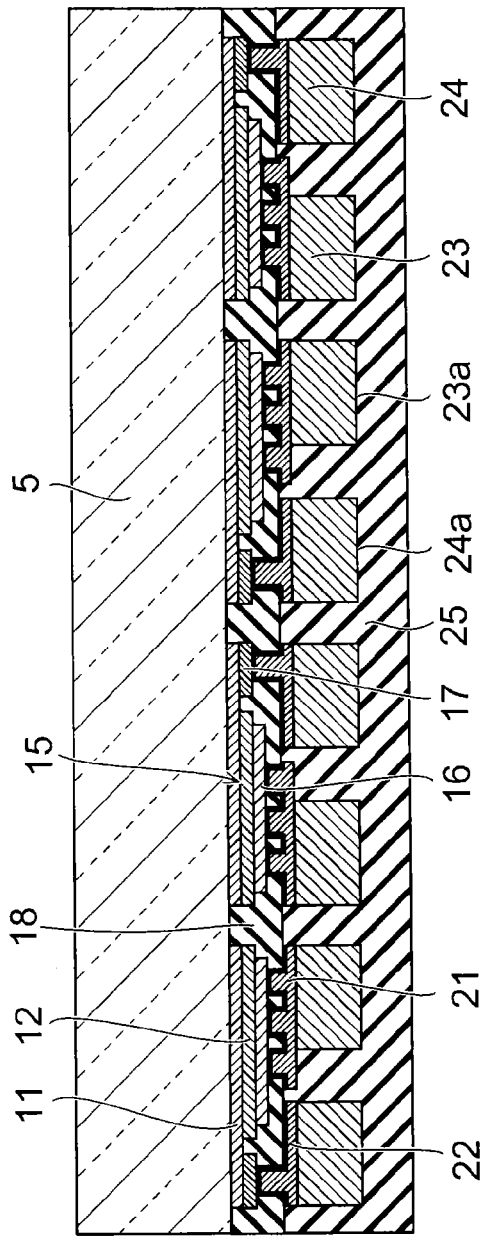
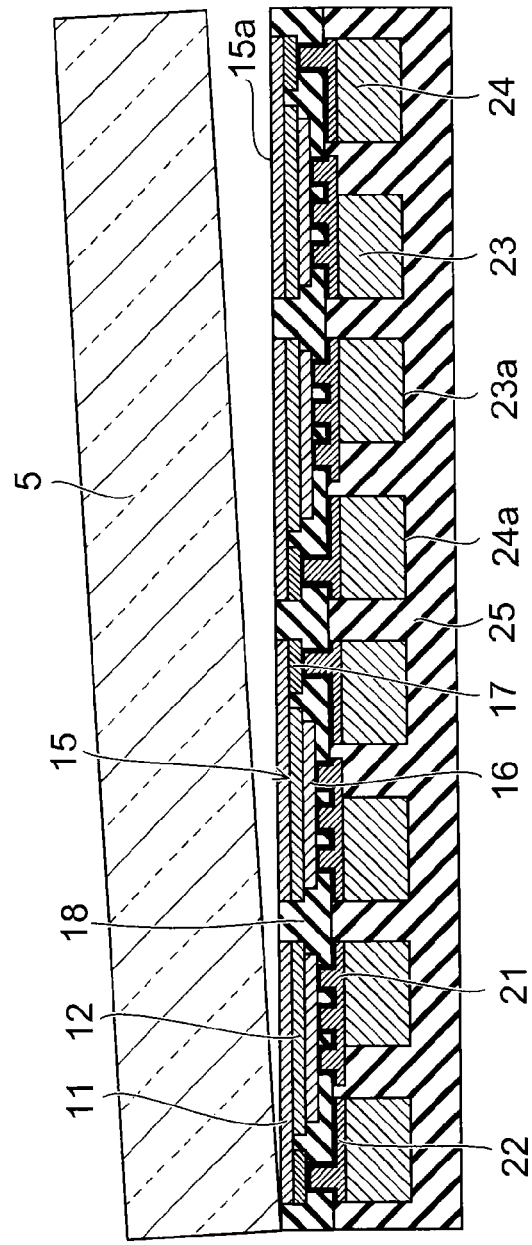
FIG. 12A
FIG. 12B

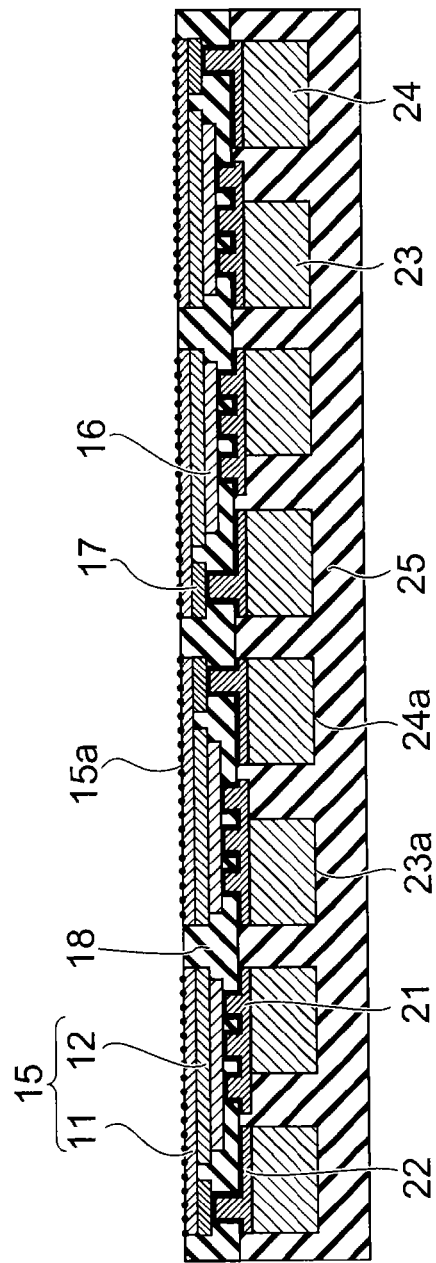
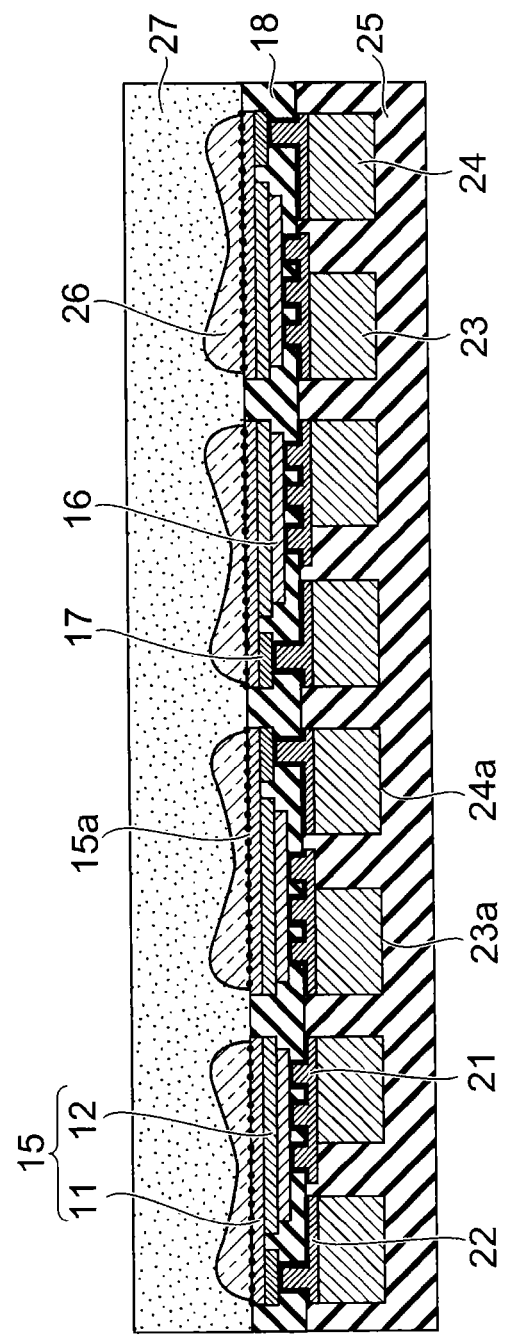
FIG. 13A
FIG. 13B

SEMICONDUCTOR LIGHT EMITTING DEVICE

CROSS-REFERENCE TO RELATED APPLICATIONS

This is a continuation application of International Application PCT/JP2011/003245, filed on Jun. 8, 2011; the entire contents of which are incorporated herein by reference. This application also claims priority to Japanese Application No. 2011-025812, filed on Feb. 9, 2011. The entire contents of each are incorporated herein by reference.

FIELD

Embodiments of this invention are concerning a semiconductor light emitting device.

BACKGROUND

In wafer-level LED packaging technology in which the packaging process is performed collectively in the wafer state, a mark provided in the exterior form of the individual semiconductor light emitting elements after the singulation to discriminate the anode and the cathode when mounting leads to lower productivity.

BRIEF DESCRIPTION OF THE DRAWINGS

FIGS. 3A to 14B are schematic views illustrating a method for manufacturing the semiconductor light emitting device of the embodiment.

DETAILED DESCRIPTION

Figure 1A:
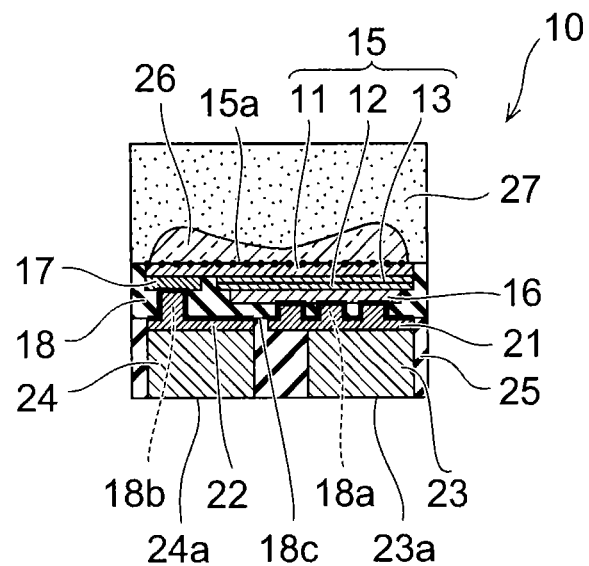
FIG. 1A is a schematic cross-sectional view of a semiconductor light emitting device of an embodiment.

According to one embodiment, a semiconductor light emitting device includes a semiconductor layer, a p-side electrode, an n-side electrode, a p-side metal pillar, an n-side metal pillar, and an insulator. The semiconductor layer includes a first surface, a second surface opposite to the first surface, and a light emitting layer. The p-side electrode is provided on a region of the second surface including the light emitting layer. The n-side electrode is provided on a region of the second surface not including the light emitting layer. The p-side metal pillar is provided on the second surface side. The p-side metal pillar is electrically connected to the p-side electrode. The n-side metal pillar is provided apart from the p-side metal pillar on the second surface side. The n-side metal pillar is electrically connected to the n-side electrode. The insulator is provided at least between the p-side metal pillar and the n-side metal pillar. The p-side metal pillar includes a p-side external terminal exposed from the insulator at a surface different from a surface connected to the p-side electrode. The n-side metal pillar includes an n-side external terminal exposed from the insulator at a surface different from a surface connected to the n-side electrode. At least one selected from an area and a planar configuration of the p-side external terminal is different from at least one selected from an area and a planar configuration of the n-side external terminal.

Various embodiments will be described hereinafter with reference to the accompanying drawings. Similar components in the drawings are marked with like reference numerals. In the drawings illustrating manufacturing processes, a region of a portion of a wafer including multiple semiconductor layers 15 (chips) is illustrated.

FIG. 1A is a schematic cross-sectional view of the semiconductor light emitting device 10 of the embodiment.

Figure 1B:
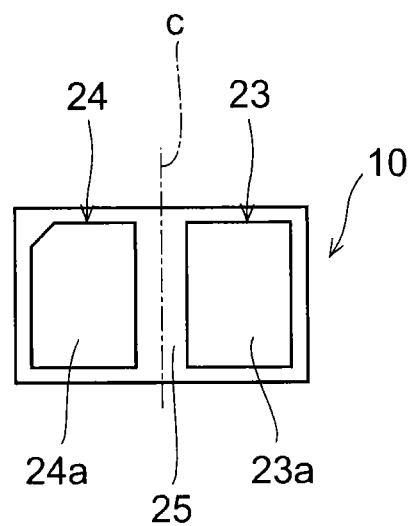
FIG. 1B is a schematic plan view of external terminals of the semiconductor light emitting device of the embodiment.

FIG. 1B is a schematic plan view of a mounting surface including a p-side external terminal 23a and an n-side external terminal 24a of the same semiconductor light emitting device 10.

The semiconductor light emitting device 10 includes the semiconductor layer 15. The semiconductor layer 15 includes a first surface 15a and a second surface 15b opposite to the first surface 15a (shown, for example, in FIG. 3A). Electrodes and interconnect layers are provided on the second surface side. Light is emitted to the outside mainly from the first surface 15a opposite to the second surface 15b.

The semiconductor layer 15 includes a first semiconductor layer 11 and a second semiconductor layer 12. Both the first semiconductor layer 11 and the second semiconductor layer 12 include, for example, a nitride semiconductor. The first semiconductor layer 11 includes, for example, a foundation buffer layer, an n-type layer, etc.; and the n-type layer functions as a lateral-direction path of current. The second semiconductor layer 12 includes a stacked structure in which a light emitting layer (an active layer) 13 is interposed between the n-type layer and a p-type layer.

The second surface of the semiconductor layer 15 is patterned into an uneven configuration. The protrusion formed on the second surface includes the light emitting layer 13. A p-side electrode 16 is provided on the top surface of the second semiconductor layer 12 which is the top surface of the protrusion. The p-side electrode 16 is provided on the region including the light emitting layer 13.

A region where there is no second semiconductor layer 12 is provided on the second surface of the semiconductor layer 15 beside the protrusion; and an n-side electrode 17 is provided on the top surface of the first semiconductor layer 11 of the region. The n-side electrode 17 is provided on a region not including the light emitting layer 13.

On the second surface of the semiconductor layer 15 as illustrated in FIG. 5B, the area of the second semiconductor layer 12 including the light emitting layer 13 is greater than the area of the first semiconductor layer 11 that not including the light emitting layer 13.

In one semiconductor layer 15 as illustrated in FIG. 6B, the p-side electrode 16 provided on the region including the light emitting layer 13 has an area greater than that of the n-side electrode 17 not including the light emitting layer 13. Thereby, a wide light emitting region is obtained. The layout of the p-side electrode 16 and the n-side electrode 17 illustrated in FIG. 6B is one example and is not limited thereto.

An insulating layer 18 is provided on the second surface side of the semiconductor layer 15. The insulating layer 18 covers the semiconductor layer 15, the p-side electrode 16, and the n-side electrode 17. There are also cases where another insulating film (e.g., a silicon oxide film) is provided between the insulating layer 18 and the semiconductor layer 15. The insulating layer 18 is, for example, a resin such as polyimide having excellent patternability for ultra-fine openings. Alternatively, an inorganic substance such as silicon oxide, silicon nitride, etc., may be used as the insulating layer 18.

The insulating layer 18 includes an interconnect surface 18c on the side opposite to the semiconductor layer 15. A p-side interconnect layer 21 and an n-side interconnect layer 22 are provided separately from each other on the interconnect surface 18c.

The p-side interconnect layer 21 is provided also inside a first via 18a made in the insulating layer 18 to reach the p-side electrode 16 and is electrically connected to the p-side electrode 16. It is not always necessary for the p-side interconnect layer 21 to be formed on the insulating layer 18. For example, a structure may be used in which the p-side interconnect layer 21 is provided only on the p-side electrode 16.

The n-side interconnect layer 22 is provided also inside a second via 18b made in the insulating layer 18 to reach the n-side electrode 17 and is electrically connected to the n-side electrode 17.

A p-side metal pillar 23 is provided on the surface of the p-side interconnect layer 21 on the side opposite to the p-side electrode 16. An n-side metal pillar 24 is provided on the surface of the n-side interconnect layer 22 on the side opposite to the n-side electrode 17.

A resin layer 25 is provided as an insulator on the interconnect surface 18c of the insulating layer 18. The resin layer 25 covers the p-side interconnect layer 21 and the n-side interconnect layer 22. The resin layer 25 covers all side surfaces of the p-side metal pillar 23 and the n-side metal pillar 24. The resin layer 25 is filled between the p-side metal pillar 23 and the n-side metal pillar 24.

The surface of the p-side metal pillar 23 on the side opposite to the p-side interconnect layer 21 functions as the p-side external terminal 23a. The surface of the n-side metal pillar 24 on the side opposite to the n-side interconnect layer 22 functions as the n-side external terminal 24a.

The p-side external terminal 23a and the n-side external terminal 24a are exposed from the resin layer 25 and bonded with a bonding agent such as solder, another metal, electrically conductive material, etc., to a pad formed on a mounting substrate.

The distance between the p-side external terminal 23a and the n-side external terminal 24a exposed at the mounting surface is greater than the distance between the p-side interconnect layer 21 and the n-side interconnect layer 22 on the interconnect surface 18c of the insulating layer 18. In other words, the p-side external terminal 23a and the n-side external terminal 24a are separated by a distance such that the p-side external terminal 23a and the n-side external terminal 24a are not shorted to each other by the solder, etc., when mounting to the mounting substrate.

The planar size of the p-side interconnect layer 21 is greater than the planar size of the p-side external terminal 23a. The p-side interconnect layer 21 can be formed using a low-resistance metal such as, for example, copper. Therefore, it is possible to supply current to the second semiconductor layer 12 with a more uniform distribution as the area of the p-side interconnect layer 21 increases. Further, the thermal conductivity of the p-side interconnect layer 21 also can be increased; and it is possible also to efficiently release the heat of the second semiconductor layer 12.

The p-side electrode 16 spreads to the region including the light emitting layer 13. Accordingly, by connecting the p-side interconnect layer 21 and the p-side electrode 16 via the multiple first vias 18a, the current distribution to the light emitting layer 13 can be improved and the heat dissipation of the heat of the light emitting layer 13 also can be improved.

The contact area between the n-side interconnect layer 22 and the n-side metal pillar 24 is greater than the contact area between the n-side interconnect layer 22 and the n-side electrode 17. Also, a portion of the n-side interconnect layer 22 extends over the interconnect surface 18c of the insulating layer 18 to a position extending under the light emitting layer 13.

Thereby, an electrode having a wider draw-out can be formed via the n-side interconnect layer 22 from the n-side electrode 17 provided in the narrow region not including the light emitting layer 13 while obtaining a high light output by the light emitting layer 13 being formed over a wide region.

The contact area between the p-side interconnect layer 21 and the p-side metal pillar 23 is greater than the contact area between the p-side interconnect layer 21 and the p-side electrode 16. Alternatively, the contact area between the p-side interconnect layer 21 and the p-side metal pillar 23 is less than the contact area between the p-side interconnect layer 21 and the p-side electrode 16.

The first semiconductor layer 11 is electrically connected to the n-side metal pillar 24 via the n-side electrode 17 and the n-side interconnect layer 22. The second semiconductor layer 12 including the light emitting layer 13 is electrically connected to the p-side metal pillar 23 via the p-side electrode 16 and the p-side interconnect layer 21.

The p-side metal pillar 23 is thicker than the p-side interconnect layer 21; and the n-side metal pillar 24 is thicker than the n-side interconnect layer 22. Therefore, the mechanical strength of the semiconductor light emitting device 10 can be increased by the p-side metal pillar 23, the n-side metal pillar 24, and the resin layer 25 filled between the p-side metal pillar 23 and the n-side metal pillar 24 even without a substrate supporting the semiconductor layer 15.

Copper, gold, nickel, silver, etc., can be used as the material of the p-side interconnect layer 21, the n-side interconnect layer 22, the p-side metal pillar 23, and the n-side metal pillar 24. Of these, in the case where copper is used, good thermal conductivity, high migration resistance, and excellent adhesion with the insulating material are obtained.

The resin layer 25 reinforces the p-side metal pillar 23 and the n-side metal pillar 24. It is desirable for the resin layer 25 to have a coefficient of thermal expansion near to or the same as that of the mounting substrate. Examples of such a resin layer 25 include, for example, an epoxy resin, a silicone resin, a fluorocarbon resin, etc.

The thickness of the p-side metal pillar 23 and the thickness of the n-side metal pillar 24 (the thicknesses in the vertical direction in FIG. 1A) are thicker than the thickness of the stacked body including the semiconductor layer 15, the p-side electrode 16, the n-side electrode 17, and the insulating layer 18. The aspect ratio (the ratio of the thickness to the planar size) of each of the metal pillars 23 and 24 is not limited to being not less than 1; and the ratio thereof may be less than 1. In other words, it is sufficient for the thicknesses of the metal pillars 23 and 24 to be less than the planar sizes thereof.

According to the embodiment, it is possible to maintain the mechanical strength by the p-side metal pillar 23, the n-side metal pillar 24, and the resin layer 25 being thick even in the case where the semiconductor layer 15 is thin and there is no substrate to support the semiconductor layer 15.

Further, in the state in which the semiconductor light emitting device 10 is mounted to a mounting substrate, the stress applied to the semiconductor layer 15 via the solder, etc., can be mitigated by being absorbed by the p-side metal pillar 23 and the n-side metal pillar 24.

A lens 26 and a phosphor layer 27 are provided on the first surface 15a of the semiconductor layer 15 as a transparent body transparent to the light emitted from the light emitting layer 13. The lens 26 is provided on the first surface 15a; and the phosphor layer 27 is provided to cover the lens 26.

The phosphor layer 27 includes a transparent resin and a phosphor dispersed in the transparent resin. The phosphor layer 27 is capable of absorbing the light emitted from the light emitting layer 13 and emitting a wavelength-converted light. Therefore, the semiconductor light emitting device 10 is capable of emitting a mixed light of the light from the light emitting layer 13 and the wavelength-converted light of the phosphor layer 27.

For example, white or lamp, etc., can be obtained as the mixed color of a blue light from the light emitting layer 13 and a yellow light which is the wavelength-converted light of the phosphor layer 27 in the case where the light emitting layer 13 is a nitride semiconductor and the phosphor is a yellow phosphor configured to emit the yellow light. The phosphor layer 27 may have a configuration including multiple types of phosphors (e.g., a red phosphor configured to emit red light and a green phosphor configured to emit green light).

Figure 15A:
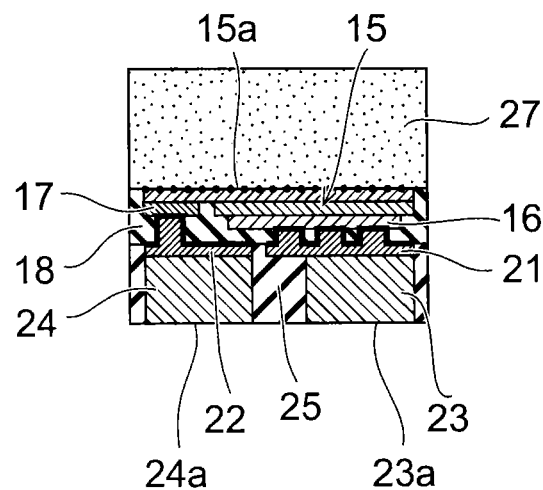
FIGS. 15A and 15B are schematic cross-sectional views of a semiconductor light emitting device of another embodiment.

The light emitted from the light emitting layer 13 is emitted to the outside by traveling through mainly the first semiconductor layer 11, the first surface 15a, the lens 26, and the phosphor layer 27. The lens 26 may be provided on the phosphor layer 27. As illustrated in FIG. 15A, a lens may not be provided.

When mounting, the identification of the anode and the cathode of the semiconductor light emitting device 10 is necessary. In the semiconductor light emitting device 10 of the embodiment, as described below, the components described above are formed collectively in the wafer state. One surface of the wafer is a light emitting surface; and another surface on the side opposite thereto is used to form a mounting surface. In particular, the visibility of the components thereunder is poor in a structure in which the phosphor layer 27 is provided on the light emitting surface. Accordingly, it is difficult to identify the p-side electrode 16 and the n-side electrode 17 from the light emitting surface side. Also, the light emission characteristic may be affected when an identification mark is provided on the light emitting surface side.

Moreover, it is difficult to identify the p-side electrode 16 and the n-side electrode 17 from the mounting surface side because the resin layer 25, the p-side external terminal 23a, and the n-side external terminal 24a are provided on the mounting surface side. It is also conceivable to provide the identification mark in the side surface of the semiconductor light emitting device. However, in such a case, the manufacturing efficiency is extremely poor because patterning of the side surface of the individual semiconductor light emitting devices is performed after being singulated from the wafer state.

Therefore, in the embodiment, at least one selected from the area and the planar configuration of the p-side external terminal 23a is different from the at least one selected from the area and the planar configuration of the n-side external terminal 24a. The p-side external terminal 23a and the n-side external terminal 24a are provided on the other surface side of the wafer. Therefore, it is possible to arbitrarily design the area and the planar configuration of the p-side external terminal 23a and the n-side external terminal 24a collectively for the multiple semiconductor light emitting devices in the wafer state. Accordingly, this does not lead to a decrease of the productivity.

Specifically, one selected from p-side external terminal 23a and the n-side external terminal 24a is formed in a first configuration; and the other selected from the p-side external terminal and the n-side external terminal is formed in a second configuration without a portion of the first configuration. More specifically, as illustrated in FIG. 1B, the p-side external terminal 23a is formed in a quadrilateral; and the n-side external terminal 24a is formed in a configuration of the quadrilateral without a corner of a portion of the quadrilateral.

Thereby, the p-side external terminal 23a, which is the anode terminal, and the n-side external terminal 24a, which is the cathode terminal, can be discriminated instantaneously by image recognition or the naked eye in the mounting process.

Also, it is necessary for the p-side external terminal 23a which is connected to the light emitting layer 13 to have higher heat dissipation than the n-side external terminal 24a. Accordingly, it is desirable for the area of the p-side external terminal 23a to be greater than the area of the n-side external terminal 24a. It is desirable for the n-side external terminal 24a to be the configuration without the portion.

In the case of a rectangular mounting surface as illustrated in FIG. 1B, the semiconductor light emitting device may tilt in the short-side direction when mounting. Stability during the mounting also is necessary in the design of the p-side external terminal 23a and the n-side external terminal 24a. Therefore, as illustrated in FIG. 1B, it is desirable for the p-side external terminal 23a and the n-side external terminal 24a to be laid out symmetrically around a center line c dividing the longitudinal direction of the mounting surface having the rectangular configuration into two equal parts.

Further, better stability is provided during the mounting by the difference of the exterior configuration and the area between the p-side external terminal 23a and the n-side external terminal 24a being as small as possible. As illustrated in FIG. 1B, a design having better identifiability between the p-side external terminal 23a and the n-side external terminal 24a can be realized without changing the exterior configuration and the area very much between the p-side external terminal 23a and the n-side external terminal 24a by one selected from the p-side external terminal 23a and the n-side external terminal 24a being a quadrilateral and the other selected from the p-side external terminal 23a and the n-side external terminal 24a being the quadrilateral without a corner of a portion of the quadrilateral. Other than the portion without the corner, the exterior configuration, the exterior form size, and the area of n-side external terminal 24a are the same as those of the p-side external terminal 23a.

The planar configuration of the p-side external terminal 23a and the n-side external terminal 24a may be circular or elliptical. However, when comparing with the same mounting surface, the areas of the p-side external terminal 23a and the n-side external terminal 24a can be greater for a quadrilateral than for a circle or an ellipse.

A method for manufacturing the semiconductor light emitting device 10 of the embodiment will now be described with reference to FIG. 3A to FIG. 14B. In the drawings illustrating the processes, a region of a portion of the wafer state is illustrated.

FIG. 3A illustrates a stacked body of the first semiconductor layer 11 and the second semiconductor layer 12 formed on a major surface of a substrate 5. FIG. 3B corresponds to a bottom view of FIG. 3A.

The first semiconductor layer 11 is formed on the major surface of the substrate 5; and the second semiconductor layer 12 including the light emitting layer 13 is formed thereon. In the case where the first semiconductor layer 11 and the second semiconductor layer 12 are, for example, nitride semiconductors, crystal growth of these may be performed by, for example, metal organic chemical vapor deposition (MOCVD) on a sapphire substrate.

For example, the first semiconductor layer 11 includes a foundation buffer layer and an n-type GaN layer. The second semiconductor layer 12 includes the light emitting layer (the active layer) 13 and a p-type GaN layer. The light emitting layer 13 may be configured to emit blue, violet, bluish-violet, and ultraviolet light, etc.

The surface of the first semiconductor layer 11 contacting the substrate 5 is the first surface 15a of the semiconductor layer 15; and the top surface of the second semiconductor layer 12 is a second surface 15b of the semiconductor layer 15.

Figure 4A:
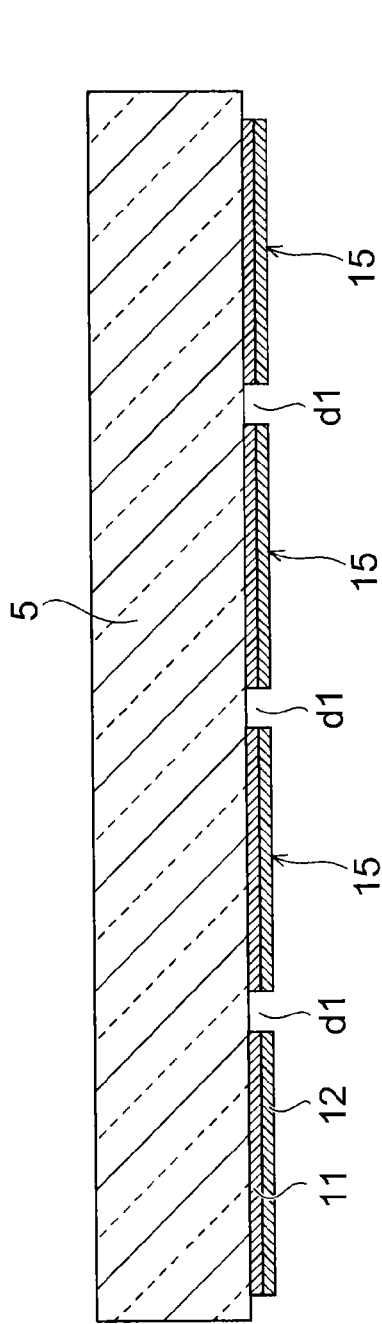
Figure 4B:
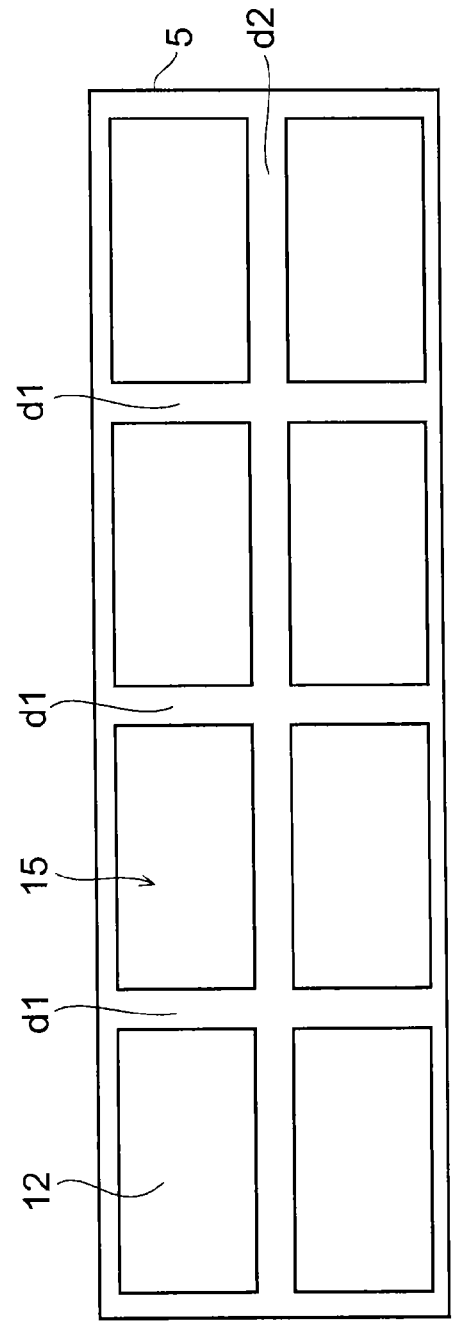

Then, a trench is made to reach the substrate 5 by piercing the semiconductor layer 15 in dicing regions d1 and d2 as illustrated in FIG. 4A and FIG. 4B which is the bottom view thereof by, for example, Reactive Ion Etching (RIE) using a not-illustrated resist. The dicing regions d1 and d2 are formed, for example, in a lattice configuration on the substrate 5 in the wafer state. The trench made in the dicing regions d1 and d2 also is made in a lattice configuration to separate the semiconductor layer 15 into multiple chips.

The process of separating the semiconductor layer 15 into a plurality may be performed after a selective removal of the second semiconductor layer 12 described below or after forming the electrodes.

Then, a portion of the first semiconductor layer 11 is exposed by removing a portion of the second semiconductor layer 12 as illustrated in FIG. 5A and FIG. 5B which is the bottom view thereof by, for example, RIE using a not-illustrated resist. The region where the first semiconductor layer 11 is exposed does not include the light emitting layer 13.

Continuing as illustrated in FIG. 6A and FIG. 6B which is the bottom view thereof, the p-side electrode 16 and the n-side electrode 17 are formed on the second surface. The p-side electrode 16 is formed on the top surface of the second semiconductor layer 12. The n-side electrode 17 is formed on the exposed surface of the first semiconductor layer 11.

The p-side electrode 16 and the n-side electrode 17 may be formed by, for example, sputtering, vapor deposition, etc. Either the p-side electrode 16 or the n-side electrode 17 may be formed first; and the p-side electrode 16 and the n-side electrode 17 may be formed simultaneously from the same material.

The p-side electrode 16 includes, for example, silver, silver alloy, aluminum, aluminum alloy, etc., that are reflective with respect to the emitted light from the light emitting layer 13. Also, a configuration including a metal protective film to prevent the sulfidization and the oxidization of the p-side electrode 16 may be used.

Further, a silicon nitride film and/or a silicon oxide film, for example, may be formed by chemical vapor deposition (CVD) as a passivation film between the p-side electrode 16 and the n-side electrode 17 and on the end surface (the side surface) of the light emitting layer 13. Activation annealing, etc., to provide an ohmic contact between the semiconductor layer and the electrodes may be implemented if necessary.

Figure 7A:
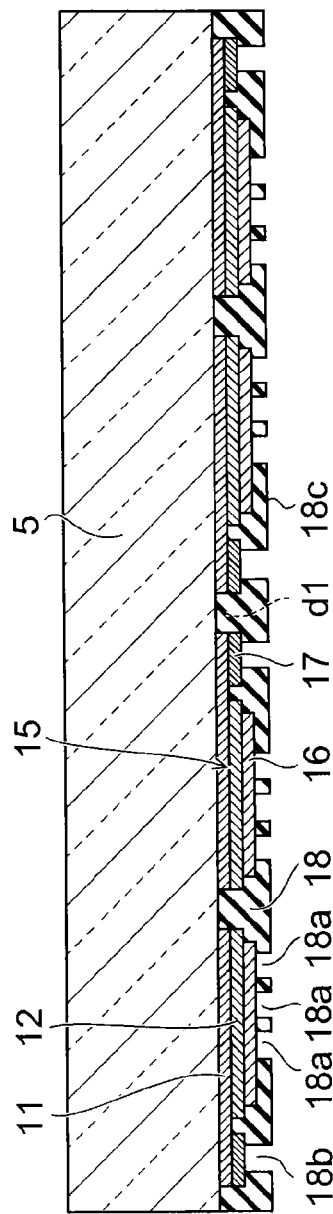

Then, as illustrated in FIG. 7A, after covering the entire exposed portion on the major surface of the substrate 5 with the insulating layer 18, the first via 18a and the second via 18b are made selectively in the insulating layer 18 by patterning the insulating layer 18 using, for example, wet etching. The first via 18a may be formed multiply. Each of the first vias 18a reaches the p-side electrode 16. The second via 18b reaches the n-side electrode 17.

An organic material, for example, such as photosensitive polyimide, benzocyclobutene, etc., may be used as the insulating layer 18. In such a case, it is possible to directly expose and develop the insulating layer 18 without using a resist. Alternatively, an inorganic film such as a silicon nitride film, a silicon oxide film, etc., may be used as the insulating layer 18. In the case of the inorganic film, the desired configuration is obtained by etching after the resist is patterned.

Figure 7B:
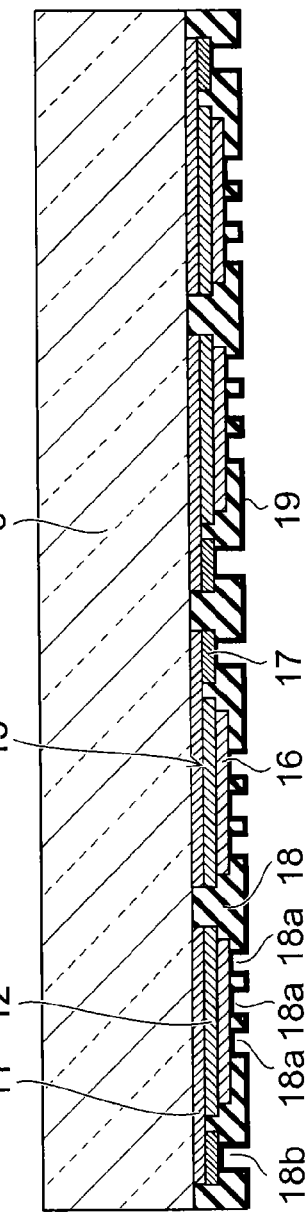

Then, as illustrated in FIG. 7B, a seed metal 19 is formed on the interconnect surface 18c of the insulating layer 18 which is the surface on the side opposite to the semiconductor layer 15. The seed metal 19 may be formed also on the inner wall and the bottom portion of the first via 18a and the inner wall and the bottom portion of the second via 18b.

The seed metal 19 may be formed using, for example, sputtering. The seed metal 19 includes, for example, a stacked film of titanium (Ti) and copper (Cu) stacked in order from the insulating layer 18 side.

Figure 7C:
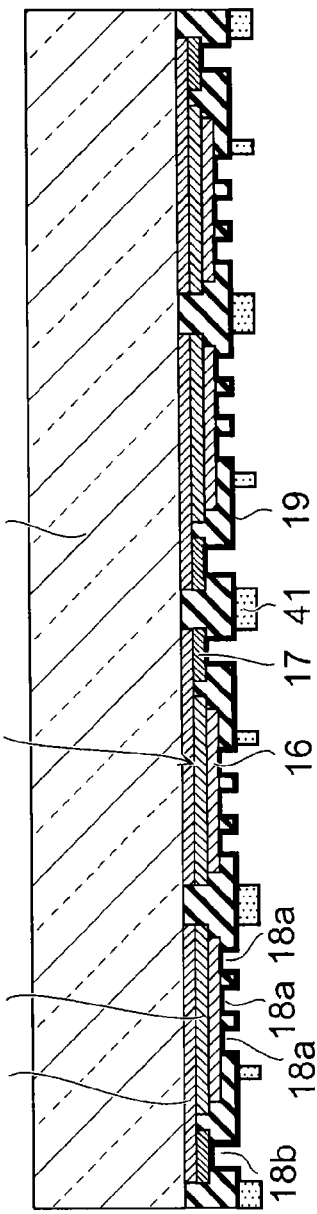

Then, as illustrated in FIG. 7C, a resist 41 is formed selectively on the seed metal 19; and Cu electroplating is performed using the seed metal 19 as a current path.

Thereby, as illustrated in FIG. 8A and FIG. 8B which is the bottom view thereof, the p-side interconnect layer 21 and the n-side interconnect layer 22 are formed selectively on the interconnect surface 18c of the insulating layer 18. The p-side interconnect layer 21 and the n-side interconnect layer 22 are made of, for example, a copper material formed simultaneously by plating.

The p-side interconnect layer 21 is formed also inside the first via 18a and is electrically connected to the p-side electrode 16 via the seed metal 19. The n-side interconnect layer 22 is formed also inside the second via 18b and is electrically connected to the n-side electrode 17 via the seed metal 19.

The p-side interconnect layer 21 can be proximal to the n-side interconnect layer 22 up to the process limitations; and the surface area of the p-side interconnect layer 21 can be wide. As a result, the p-side interconnect layer 21 and the p-side electrode 16 can be connected through multiple first vias 18a; and the current distribution and the heat dissipation can be improved.

The resist 41 used for the plating of the p-side interconnect layer 21 and the n-side interconnect layer 22 is removed using a solvent or oxygen plasma.

Figure 9A:
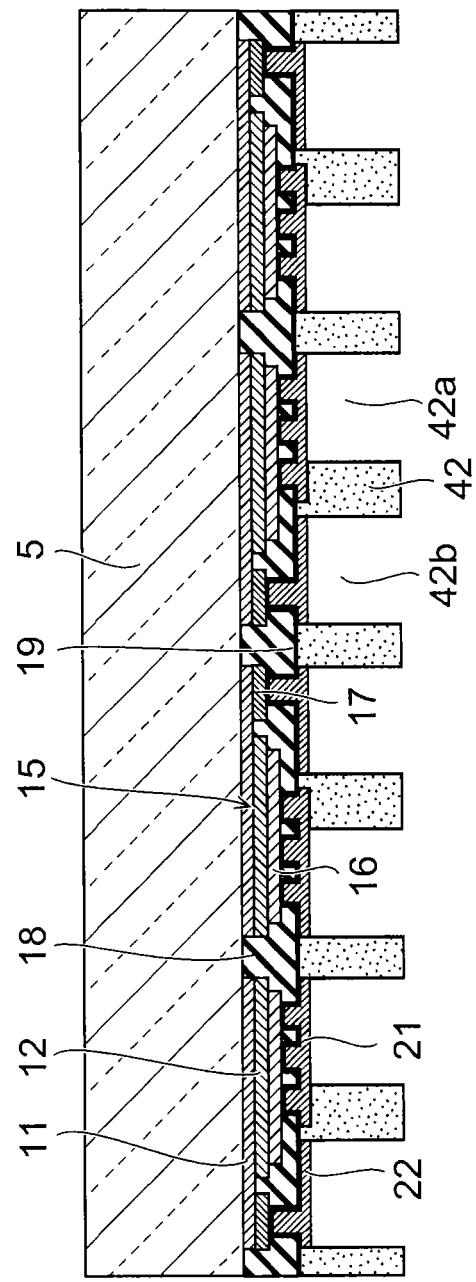
Figure 9B:
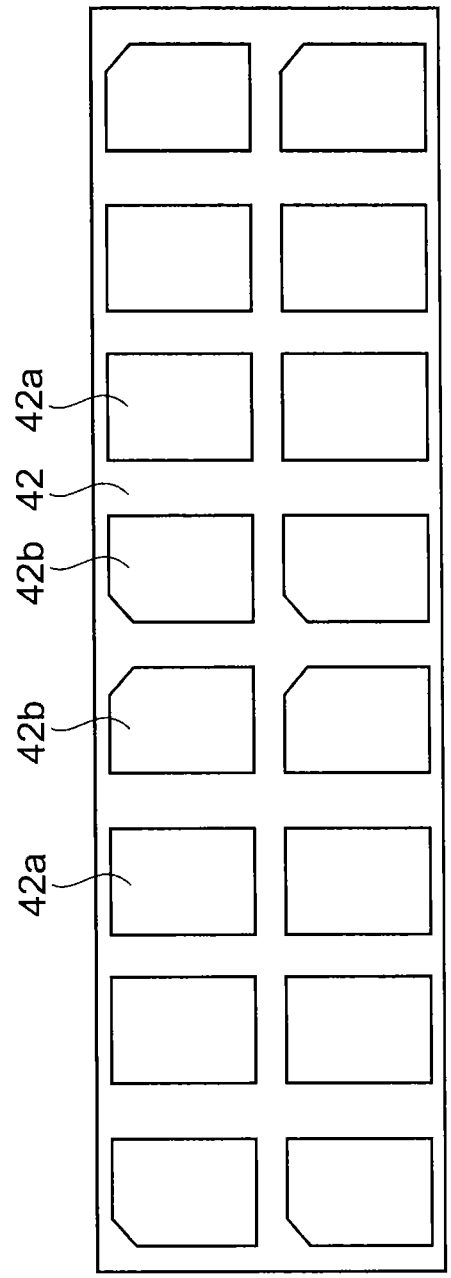

Then, as illustrated in FIG. 9A and FIG. 9B which is the bottom view thereof, a resist 42 for forming the metal pillars is formed. The resist 42 is thicker than the resist 41 described above. The resist 41 of the previous processes may remain without being removed; and the resist 42 may be formed to overlap the resist 41.

A first opening 42a and a second opening 42b are made in the resist 42. As illustrated in FIG. 9B, for example, the planar configuration of the first opening 42a is a quadrilateral; and the planar configuration of the second opening 42b is the quadrilateral of the first opening 42a without the corner of a portion of the quadrilateral.

Continuing, using the resist 42 as a mask, Cu electroplating is performed using the seed metal 19 as a current path. Thereby, as illustrated in FIG. 10A and FIG. 10B which is the bottom view thereof, the p-side metal pillar 23 and the n-side metal pillar 24 are formed.

The p-side metal pillar 23 is formed inside the first opening 42a made in the resist 42 and on the top surface of the p-side interconnect layer 21. The n-side metal pillar 24 is formed inside the second opening 42b made in the resist 42 and on the top surface of the n-side interconnect layer 22. The p-side metal pillar 23 and the n-side metal pillar 24 are made of, for example, a copper material formed simultaneously by plating.

The planar configuration of the p-side external terminal 23a is a quadrilateral conforming to the planar configuration of the first opening 42a of the resist 42. The planar configuration of the n-side external terminal 24a is the quadrilateral of the p-side external terminal 23a without the corner of a portion of the quadrilateral conforming to the planar configuration of the second opening 42b of the resist 42.

The multiple p-side external terminals 23a and n-side external terminals 24a can be formed collectively with the appropriate design in the wafer state by patterning the resist 42. It is unnecessary for the mark for identifying the anode and the cathode to be provided for every singulated individual device; and it becomes possible to drastically reduce the production costs.

Then, the resist 42 is removed using, for example, a solvent or oxygen plasma (FIG. 11A). Subsequently, the exposed portion of the seed metal 19 is removed by wet etching using the p-side metal pillar 23, the n-side metal pillar 24, and a portion of the p-side interconnect layer 21 jutting from the p-side metal pillar 23 as a mask. Thereby, as illustrated in FIG. 11B, the electrical connection between the p-side interconnect layer 21 and the n-side interconnect layer 22 via the seed metal 19 is divided.

Continuing as illustrated in FIG. 12A, the resin layer 25 is stacked on the insulating layer 18. The resin layer 25 covers the p-side interconnect layer 21, the n-side interconnect layer 22, the p-side metal pillar 23, and the n-side metal pillar 24.

The resin layer 25 is insulative. Further, the resin layer 25 may contain, for example, carbon black to make it light-shielding with respect to the light emitted from the light emitting layer. Also, the resin layer 25 may contain a powder that is reflective with respect to the light emitted from the light emitting layer.

Then, as illustrated in FIG. 12B, the substrate 5 is removed. The substrate 5 may be removed using, for example, laser lift-off. Specifically, laser light is irradiated from the back surface side of the substrate 5 toward the first semiconductor layer 11. The laser light has a wavelength that is transmissive with respect to the substrate 5 and in the absorption region of the first semiconductor layer 11.

When the laser light reaches the interface between the substrate 5 and the first semiconductor layer 11, the first semiconductor layer 11 proximal to the interface decomposes by absorbing the energy of the laser light. For example, in the case where the first semiconductor layer 11 is GaN, the first semiconductor layer 11 decomposes into gallium (Ga) and nitrogen gas. By this decomposition reaction, a micro gap is formed between the substrate 5 and the first semiconductor layer 11; and the substrate 5 and the first semiconductor layer 11 separate.

The irradiation of the laser light is performed over the entire wafer by performing multiply for every set region; and the substrate 5 is removed. The light extraction efficiency may be increased by the substrate 5 being removed from the first surface 15a.

Because the stacked body described above formed on the major surface of the substrate 5 is reinforced by the thick resin layer 25, it is possible to maintain the wafer state even in the case where there is no substrate 5. Also, the resin layer 25 and the metal included in the interconnect layers and the metal pillars are materials softer than the semiconductor layer 15. Therefore, destruction of the device can be avoided even in the case where the large internal stress generated in the epitaxial process that forms the semiconductor layer 15 on the substrate 5 is released all at once when peeling the substrate 5.

The first surface 15a of the semiconductor layer 15 from which the substrate 5 is removed is cleaned. The gallium (Ga) adhered to the first surface 15a is removed using, for example, hydrochloric acid, etc.

Further, the first surface 15a is etched using, for example, a KOH (potassium hydroxide) aqueous solution, TMAH (tetramethylammonium hydroxide), etc. Thereby, an unevenness is formed in the first surface 15a due to the difference of the etching rates that depend on the crystal plane orientation (FIG. 13A). Alternatively, the unevenness may be formed in the first surface 15a by performing the etching after the patterning using the resist. The light extraction efficiency can be increased by the unevenness being formed in the first surface 15a.

Then, as illustrated in FIG. 13B, the lens 26 is formed on the first surface 15a. The lens 26 is transparent to the light emitted from the light emitting layer; and, for example, a silicone resin, an acrylic resin, glass, etc., may be used. The lens 26 can be formed by, for example, etching using a gray-scale mask and/or imprinting.

Continuing, the phosphor layer 27 is formed on the first surface 15a and on the insulating layer 18 exposed between the mutually-adjacent semiconductor layer 15 to cover the lens 26. For example, a liquid transparent resin having dispersed phosphor particles is supplied using a method such as printing, potting, molding, compression molding, etc., and is subsequently thermally cured. The transparent resin is transmissive to the light emitted from the light emitting layer and the light emitted by the phosphor; and, for example, a material such as a silicone resin, an acrylic resin, liquid glass, etc., may be used.

Then, the top surface of the resin layer 25 is polished to expose the p-side external terminal 23a and the n-side external terminal 24a.

Figure 14A:
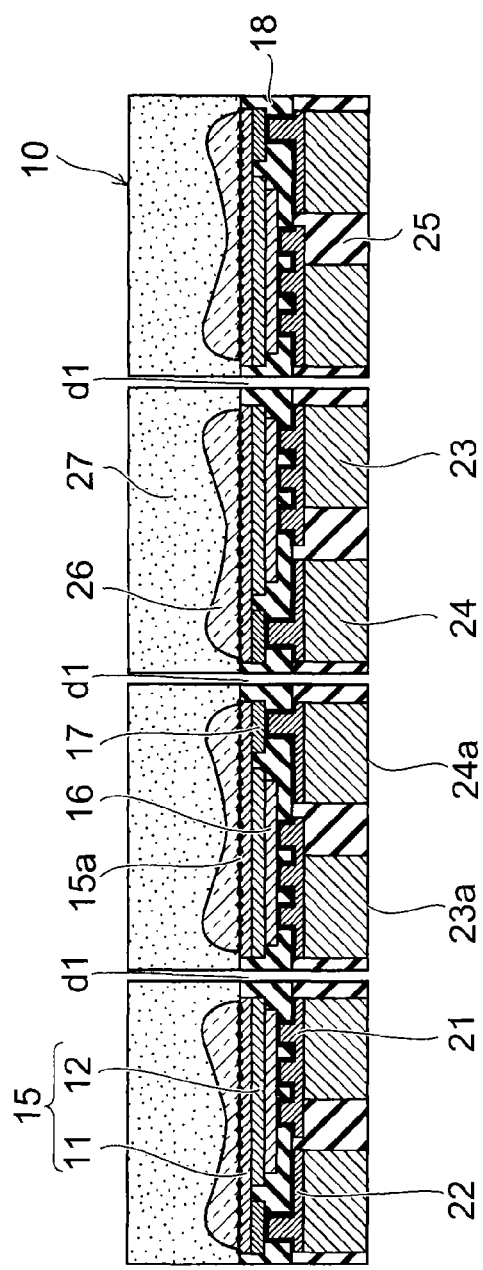
Figure 14B:
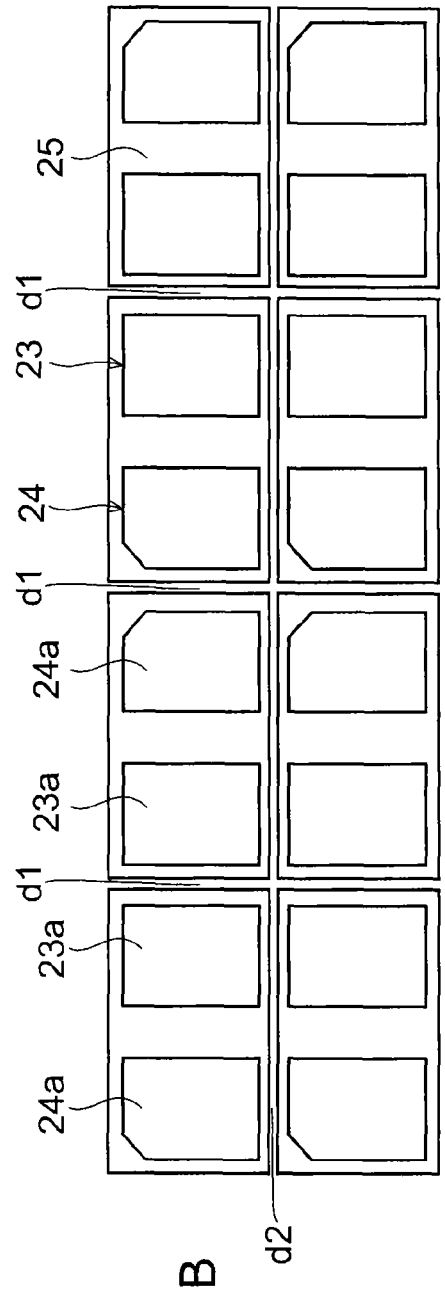

Continuing as illustrated in FIGS. 14A and 14B, the phosphor layer 27, the insulating layer 18, and the resin layer 25 are cut at the positions where the dicing regions d1 and d2 are formed in the lattice configuration to singulate into the multiple semiconductor light emitting devices 10. For example, the cutting is performed using a dicing blade. Alternatively, the cutting may be performed using laser irradiation.

When dicing, the substrate 5 is already removed. Further, damage to the semiconductor layer 15 during the dicing can be avoided because the semiconductor layer 15 does not exist in the dicing regions d1 and d2. Also, a structure is obtained in which the end portion (the side surface) of the semiconductor layer 15 is protected by being covered with the resin after the singulation.

The singulated semiconductor light emitting device 10 may have a single-chip structure including one semiconductor layer 15 or a multi-chip structure including multiple semiconductor layers 15.

It is unnecessary to perform the interconnect and the packaging for every singulated individual device and it becomes possible to drastically reduce the production costs because each of the processes described above up to prior to the dicing is performed collectively in the wafer state. The interconnect and the packaging are already completed in the singulated state. Therefore, the productivity can be increased; and as a result, price reductions become easy.

Figure 15B:
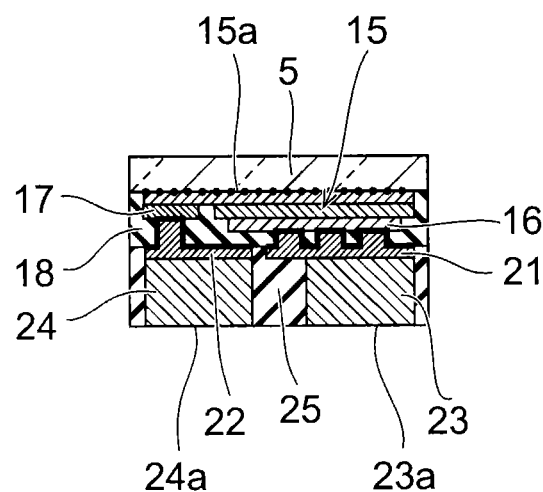

Further, the substrate 5 may thinly remain on the first surface 15a as illustrated in FIG. 15B. For example, the substrate 5 can be polished using a grinder for polishing a semiconductor wafer back surface, etc.

The substrate 5 is, for example, a sapphire substrate and is transmissive to the light emitted from the nitride semiconductor-type light emitting layer. In such a case, because there is no phosphor layer, light having the same wavelength as the light emitted from the light emitting layer is emitted to the outside from the light emitting device. Of course, a phosphor layer may be formed on the substrate 5.

The mechanical strength can be increased and a structure having high reliability is possible by leaving the substrate 5.

When dicing, a half-cut can be made using a dicing blade from the resin layer 25 side; and subsequently, the substrate 5 can be subdivided using laser irradiation. Alternatively, all portions may be cut using laser irradiation.

FIG. 2A to FIG. 2D illustrate other design examples of the p-side external terminal 23a and the n-side external terminal 24a.

Figure 2A:
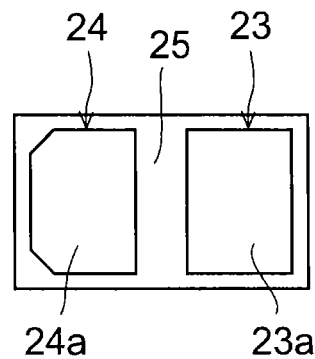
FIG. 2A to FIG. 2D illustrate other specific examples of the external terminals of the semiconductor light emitting device of the embodiment.

As illustrated in FIG. 2A, the n-side external terminal 24a may be a quadrilateral without corners at two locations. In such a case as well, a design having good identifiability between the p-side external terminal 23a and the n-side external terminal 24a can be realized without changing the exterior configuration and the area very much between the p-side external terminal 23a and the n-side external terminal 24a.

Figure 2B:
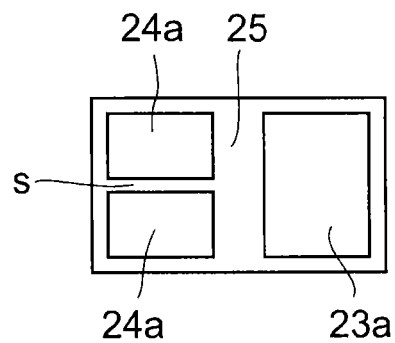

Also, as illustrated in FIG. 2B, a design may be used in which the p-side external terminal 23a and the n-side external terminal 24a have the same exterior configuration and the exterior form size and a slit s is made in one selected from the p-side external terminal 23a and the n-side external terminal 24a.

In FIG. 2B, the n-side external terminal 24a is divided into two equal parts in the short-side direction of the mounting surface by the slit s. The stress of the short-side direction of the mounting surface is balanced during the mounting and stable mounting is possible by the two n-side external terminals 24a subdivided by the slit s having the same exterior configuration and area.

In the form of FIG. 2B as well, a design having good identifiability between the p-side external terminal 23a and the n-side external terminal 24a can be realized without changing the exterior configuration and the area very much between the p-side external terminal 23a and the n-side external terminal 24a. The identifiability is better because the number of the p-side external terminals 23a also is different from the number of the n-side external terminals 24a.

Figure 2C:
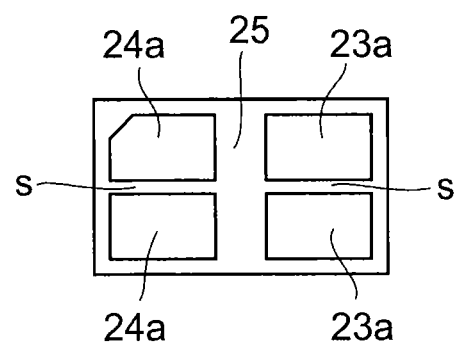

As illustrated in FIG. 2C, the p-side external terminal 23a also may be divided into two equal parts in the short-side direction of the mounting surface by the slit s. In this case, the corner of one n-side external terminal 24a of the two n-side external terminals 24a, for example, is removed to identify the p-side external terminal 23a and the n-side external terminal 24a.

Figure 2D:
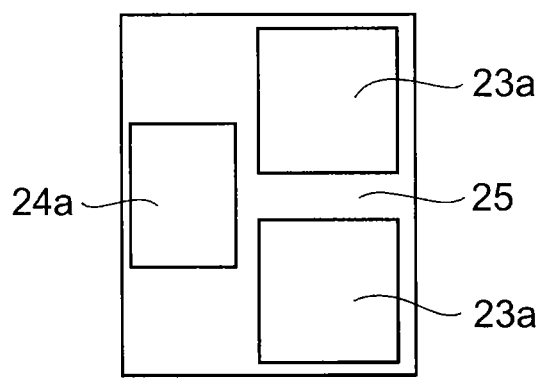

As illustrated in FIG. 2D, the numbers of the p-side external terminals 23a and the n-side external terminals 24a may be changed; and the areas of the individual p-side external terminals 23a and the individual n-side external terminals 24a may be changed.

In the case of FIG. 2D, one n-side external terminal 24a and two p-side external terminals 23a are provided. Further, the area of each of the individual p-side external terminals 23a is greater than that of the n-side external terminal 24a. Therefore, the heat dissipation of the p-side external terminals 23a connected to the light emitting layer 13 can be better.

The red phosphor layer, the yellow phosphor layer, the green phosphor layer, and the blue phosphor layer described below can be used as the phosphor layer described above.

The red phosphor layer can contain, for example, a nitride-based phosphor of $CaAlSiN_3$:Eu or a SiAlON-based phosphor.

In the case where a SiAlON-based phosphor is used,

$$(M_{1-x}R_x)_{a1}AlSi_{b1}O_{c1}N_{d1} \qquad \text{Compositional Formula (1)}$$

can be used (where M is at least one type of metal element excluding Si and Al, and it may be desirable for M to be at least one selected from Ca and Sr; R is a light emission center element, and it may be desirable for R to be Eu; and x, a1, b1, c1, and d1 satisfy the following relationships: x is larger than 0 and 1 or less, a1 is larger than 0.6 and less than 0.95, b1 is larger than 2 and less than 3.9, c1 is larger than 0.25 and less than 0.45, and d1 is larger than 4 and less than 5.7).

By using the SiAlON-based phosphor of Compositional Formula (1), the temperature characteristics of the wavelength conversion efficiency can be improved; and the efficiency in the high current density region can be increased further.

The yellow phosphor layer can contain, for example, a silicate-based phosphor of $(Sr, Ca, Ba)_2SiO_4$:Eu.

The green phosphor layer can contain, for example, a halophosphate-based phosphor of $(Ba, Ca, Mg)_{10}(PO_4)_6Cl_2$:Eu or a SiAlON-based phosphor.

In the case where a SiAlON-based phosphor is used,

$$(M_{1-x}R_x)_{a2}AlSi_{b2}O_{c2}N_{d2} \qquad \text{Compositional Formula (2)}$$

can be used (where M is at least one type of metal element excluding Si and Al, and it may be desirable for M to be at least one selected from Ca and Sr; R is a light emission center element, and it may be desirable for R to be Eu; and x, a2, b2, c2, and d2 satisfy the following relationships: x is larger than 0 and 1 or less, a2 is larger than 0.93 and less than 1.3, b2 is larger than 4.0 and less than 5.8, c2 is larger than 0.6 and less than 1, and d2 is larger than 6 and less than 11).

By using the SiAlON-based phosphor of Compositional Formula (2), the temperature characteristics of the wavelength conversion efficiency can be improved; and the efficiency in the high current density region can be increased further.

The blue phosphor layer can contain, for example, an oxide-based phosphor of $BaMgAl_{10}O_{17}$:Eu.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
    a semiconductor layer including a first surface, a second surface opposite to the first surface, and a light emitting layer provided between the first surface and the second surface;
    a p-side electrode provided on the semiconductor layer;
    an n-side electrode provided on the semiconductor layer;
    a p-side metal pillar provided on the second surface side, and electrically connected to the p-side electrode;
    an n-side metal pillar provided apart from the p-side metal pillar on the second surface side, and electrically connected to the n-side electrode; and
    an insulator provided at least between the p-side metal pillar and the n-side metal pillar,
    the p-side metal pillar including a p-side external terminal exposed from the insulator at a surface different from a surface connected to the p-side electrode, and
    the n-side metal pillar including an n-side external terminal exposed from the insulator at a surface different from a surface connected to the n-side electrode, wherein
    one selected from the p-side external terminal and the n-side external terminal is formed in a first configuration of a quadrilateral, and another selected from the p-side external terminal and the n-side external terminal is formed in a second configuration, the second configuration being a configuration without a corner of a quadrilateral having same exterior size and exterior configuration as the first configuration.

2. The device of claim 1, wherein the n-side external terminal is exposed from the insulator at a surface which faces a same direction as the surface where the p-side external terminal is exposed.

3. The device of claim 1, wherein the area of the p-side external terminal is greater than the area of the n-side external terminal.

4. The device of claim 1, wherein the p-side external terminal is formed in the first configuration and the n-side external terminal is formed in the second configuration.

5. The device of claim 1, wherein the insulator covers all side surfaces of the p-side metal pillar and the n-side metal pillar.

6. The device of claim 1, further comprising:
an insulating layer provided on the second surface side, the insulating layer having a first via communicating with the p-side electrode and a second via communicating with the n-side electrode;
a p-side interconnect layer provided at least inside the first via, and electrically connected to the p-side electrode; and
an n-side interconnect layer provided apart from the p-side interconnect layer inside the second via and on an interconnect surface of the insulating layer, the interconnect surface opposite to the semiconductor layer, the n-side interconnect layer being electrically connected to the n-side electrode,
the p-side metal pillar being provided on a surface of the p-side interconnect layer on a side opposite to a portion contacting the first via,
the n-side metal pillar being provided on a surface of the n-side interconnect layer on a side opposite to a portion contacting the second via.

7. The device of claim 6, wherein an area of the p-side interconnect layer is greater than the area of the p-side external terminal.

8. The device of claim 6, wherein an area of the n-side interconnect layer is greater than an area of the n-side electrode.

9. The device of claim 6, wherein the first via is provided in a plurality and the p-side interconnect layer is connected to the p-side electrode via the plurality of the first vias.

10. The device of claim 6, wherein the p-side metal pillar is thicker than the p-side interconnect layer.

11. The device of claim 6, wherein the n-side metal pillar is thicker than the n-side interconnect layer.

12. The device of claim 6, wherein a distance between the p-side external terminal and the n-side external terminal is greater than a distance between the p-side interconnect layer and the n-side interconnect layer.

13. The device of claim 1, further comprising a transparent body provided on the first surface, the transparent body being transparent to light emitted from the light emitting layer.

14. The device of claim 13, wherein the transparent body includes a transparent resin and a phosphor dispersed in the transparent resin.

15. The device of claim 1, wherein a substrate is not provided on the first surface side, and a transparent body is provided on the first surface side without a substrate being interposed between the transparent body and the semiconductor layer.

16. The device of claim 1, wherein the semiconductor layer is formed on a substrate, and the substrate is removed from the semiconductor layer.

17. The device of claim 16, wherein the semiconductor layer is a crystal growth layer using the substrate.

18. The device of claim 1, wherein the semiconductor layer had been formed on a substrate.

19. The device of claim 1, wherein the p-side external terminal has an end portion to be connected to a mounting member, and the n-side external terminal has an end portion to be connected to the mounting member.

20. A semiconductor light emitting device, comprising:
a semiconductor layer including a first surface, a second surface opposite to the first surface, and a light emitting layer provided between the first surface and the second surface;
a p-side electrode provided on the semiconductor layer;
an n-side electrode provided on the semiconductor layer;
a p-side metal pillar provided on the second surface side, and electrically connected to the p-side electrode;
an n-side metal pillar provided apart from the p-side metal pillar on the second surface side, and electrically connected to the n-side electrode; and
an insulator provided at least between the p-side metal pillar and the n-side metal pillar,
the p-side metal pillar including a p-side external terminal exposed from the insulator at a surface different from a surface connected to the p-side electrode, and
the n-side metal pillar including an n-side external terminal exposed from the insulator at a surface different from a surface connected to the n-side electrode, wherein
at least one selected from an area and a planar configuration of the p-side external terminal being different from at least one selected from an area and a planar configuration of the n-side external terminal, and
an exterior form of a mounting surface including the p-side external terminal and the n-side external terminal being formed in a rectangular configuration, and the p-side external terminal and the n-side external terminal being disposed symmetrically around a center line dividing a longitudinal direction of the rectangular configuration into two equal parts.

* * * * *